(12) United States Patent
Kato et al.

(10) Patent No.: US 6,327,198 B1
(45) Date of Patent: Dec. 4, 2001

(54) SEMICONDUCTOR MEMORY DEVICE HAVING A TEST MODE SETTING CIRCUIT

(75) Inventors: Tetsuo Kato; Takayuki Miyamoto; Tetsushi Tanizaki; Mikio Asakura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,087

(22) Filed: Feb. 8, 2000

(30) Foreign Application Priority Data

Jun. 25, 1999 (JP) .................................. 11-180312

(51) Int. Cl.[7] .................................................. G11C 29/00
(52) U.S. Cl. ............... 365/201; 365/230.06; 365/189.09; 714/718; 714/720
(58) Field of Search ............................... 365/201, 230.04, 365/230.06, 189.09; 714/720, 718

(56) References Cited

U.S. PATENT DOCUMENTS 5,717,652  2/1998  Ooishi .................................. 365/233
6,134,162 * 10/2000  Casper .................................. 365/201
6,247,153 *  6/2001  Jeon et al. ............................. 714/718

FOREIGN PATENT DOCUMENTS 7-99221     4/1995  (JP) ............................... H01L/21/66
10-106296   4/1998  (JP) ............................... G11C/29/00
10-199944   7/1998  (JP) ............................... H01L/21/66

* cited by examiner

Primary Examiner—Andrew Q. Tran
(74) Attorney, Agent, or Firm—McDermott, Will & Emery

(57) ABSTRACT

A semiconductor memory device according to the present invention includes: a test mode setting circuit capable of serially setting a plurality of test modes in accordance with an external signal; a voltage generating circuit; a column related control circuit; a row related control circuit; and a memory cell array. In a corresponding test mode, odd-numbered word lines/even-numbered word lines are brought into a selection/non-selection state. In the corresponding test mode, a voltage of the bit line is set higher (an internal power supply voltage) or lower (a ground voltage) than an equalization voltage in a normal operation mode. Thus, a checker pattern can efficiently be written.

14 Claims, 16 Drawing Sheets

NORMAL

TEST MODE

BCLK

SEMICONDUCTOR MEMORY DEVICE HAVING A TEST MODE SETTING CIRCUIT

BACKGROUND OF THE INVENTION

1. Field of the Invention

The present invention relates to semiconductor memory devices and, more particularly to a semiconductor memory device having a function of performing a burn-in test in a molded state.

2. Description of the Background Art

Conventionally, a burn-in test has been used for testing a memory device. In the burn-in test, a stress is applied to the device to determine its reliability.

As a storage capacity of the memory device increases, the time required for the burn-in test to apply stresses to word lines also increases. For example, while a 64-M SDRAM (a Synchronous Dynamic Random Access Memory) has 4096 word lines in total, a 256-M SDRAM has as many as 8192 word lines.

In the conventional test method, a stress has been applied to one word line at a time. However, to apply the stress to the 256-M SDRAM which is equal to the stress applied to 64-M SDRAM, twice as much burn-in time is required.

In addition, under conventional semiconductor memory device is not provided with a function of investigating the cause of malfunction.

Therefore, it is required that the test is efficiently and correctly performed in a reduced amount of time. To clearly investigate the device, a detailed test program must efficiently be performed.

SUMMARY OF THE INVENTION

Therefore, an object of the present invention is to provide a semiconductor memory device capable of effectively and correctly performing a burn-in test.

According to one aspect of the present invention, the semiconductor memory device includes: a plurality of memory cells arranged in a matrix; a memory cell array having a plurality of word lines arranged correspondingly to rows of the plurality of memory cells and a plurality of bit lines arranged correspondingly to columns of the plurality of memory cells; a test mode setting circuit serially setting a plurality of test modes in accordance with an external signal; and a memory control circuit writing a checker pattern to the memory cell array in accordance with an output from the test mode setting circuit. The memory control circuit includes; a row control circuit bringing even-numbered word lines/odd-numbered word lines of the plurality of word lines in a selection/non-selection state; and a column control circuit supplying a prescribed voltage for the plurality of bit lines in accordance with corresponding one of the plurality of test modes.

Preferably, the memory control circuit serially performs selection control for the even-numbered word lines or odd-numbered word lines and voltage control for the plurality of bit lines for writing data of different potentials for the memory cells respectively corresponding to the even-numbered word lines and odd-numbered word lines.

Preferably, the column control circuit includes a circuit determining the voltage of the plurality of bit lines as an internal power supply voltage higher than an equalization voltage or a ground voltage lower than the equalization voltage in a normal operation mode in response to the corresponding one of the plurality of test modes.

Preferably, each of the plurality of memory cells includes a memory cell capacitor having a cell plate and a storage node, and a memory cell transistor. The column control circuit further includes a circuit setting a voltage of the cell plate to the external power supply voltage or ground voltage in response to the corresponding one of the plurality of test modes.

Preferably, each of the plurality of memory cells includes a memory cell capacitor and a memory cell transistor. The column control circuit further includes a circuit setting a back gate voltage of the memory cell transistor to the ground voltage in response to the corresponding one of the plurality of test modes.

Therefore, in the semiconductor memory device according to one aspect of the present invention, the plurality of test modes are serially set in accordance with the external signal and the selection control for the word lines and the voltage control for the bit lines are performed in accordance with the test mode, so that the check pattern can readily be written.

At the time, the even-numbered and the odd-numbered word lines are brought into the selection/non-selection state. The voltage of the bit line is set higher (the internal power supply voltage) than the equalization voltage or lower (the ground voltage) than the equalization voltage in the normal operation mode. Thus, data written to the memory cells respectively corresponding to the even-numbered and odd-numbered word lines have different values. As a result, a leakage for the memory cell can readily be detected.

Particularly, a cell plate voltage of the memory cell capacitor is set higher (the external power supply voltage) or lower (the ground voltage) than the voltage in the normal operation mode in accordance with the test mode, so that the stress applied to the memory cell is acceleratingly increased.

Particularly, the back gate voltage is set to the ground voltage in accordance with the test mode. Thus, the stress is not undesirably applied to a PN junction of the memory cell.

According to another aspect of the present invention, the semiconductor memory device includes: a plurality of memory cells each having a memory cell capacitor with a storage node and a cell plate and a memory cell transistor; a test mode setting circuit setting a test mode in accordance with an external signal; and a voltage generating circuit generating a voltage supplied for the cell plate. The voltage generating circuit sets the voltage for the cell plate such that a stress is applied to the memory cell capacitor in accordance with an output from the test mode setting circuit.

Preferably, the voltage generating circuit sets the voltage for the cell plate to the external power supply voltage or the ground voltage in accordance with the output from the test mode setting circuit.

Therefore, in the semiconductor memory device according to another aspect of the present invention, the voltage for the cell plate of the memory cell capacitor is set higher (the external power supply voltage) or lower (the ground voltage) than the voltage in the normal operation mode in accordance with the test mode. Thus, the stress applied to the memory cell acceleratingly increases.

According to still another aspect of the present invention, the semiconductor memory device includes: a memory cell array having a plurality of memory cells each having a memory cell capacitor and a memory cell transistor; a test mode setting circuit setting a test mode in accordance with an external signal; a circuit writing a checker pattern to the memory cell array in accordance with a test mode; and a voltage generating circuit setting a back gate voltage of the memory cell transistor in accordance with the test mode.

Preferably, the voltage generating circuit sets the back gate voltage to the ground voltage in accordance with the test mode.

In the semiconductor memory device according to still another aspect of the present invention, the back gate voltage is set to the ground voltage in accordance with the test mode. Thus, the stress is not undesirably applied to a PN junction of the memory cell.

Another object of the present invention is to provide a semiconductor memory device which facilitates analysis of a test result.

According to still another aspect of the present invention, the semiconductor memory device includes: an internal circuit having a memory cell array; a test mode setting circuit serially setting a plurality of test modes in accordance with an external signal; a circuit writing a checker pattern to the memory cell array in accordance with an output from the test mode setting circuit; and a voltage generating circuit including a generator generating an internal voltage supplied for an internal circuit. The voltage generating circuit stops an operation of the generator in accordance with the corresponding one of the plurality of test modes.

Preferably, the voltage generating circuit further includes a fixing circuit setting the internal voltage to a fixed voltage in accordance with the corresponding one of the plurality of test modes.

Preferably, the semiconductor memory device further includes an external pad, and the voltage generating circuit further includes a circuit determining the voltage supplied from the external pad as the internal voltage in accordance with the corresponding one of the plurality of test modes.

In the semiconductor memory device according to still another aspect of the present invention, the operation of the generator generating the internal voltage is stopped in accordance with the test mode. Thus, the test is performed without applying the stress to the portion other than the memory cell. In addition, as the control for the internal power supply voltage and the selection control for the word lines are separately performed, analysis of the portion related to the malfunction is readily performed.

According to still another aspect of the present invention, the semiconductor memory device includes: a plurality of internal circuits, one of which including a memory cell array having a plurality of memory cells; a test mode setting circuit serially setting a plurality of test modes in accordance with an external signal; a voltage generating circuit setting a plurality of internal voltages supplied for the plurality of internal circuits; and an external pad. The voltage generating circuit separately sets the plurality of internal voltages based on the voltages received from the external pad in accordance with an output from the test mode setting circuit.

Preferably, the plurality of internal circuits include a first internal circuit including a memory cell array, and a second internal circuit including a peripheral circuit for selecting the memory cells. The plurality of internal voltages include a first internal voltage supplied for the first internal circuit and a second internal voltage supplied for the second internal circuit. The voltage generating circuit includes: a circuit setting a first reference voltage in response to the corresponding one of the plurality of test modes and a second reference voltage in response to the corresponding one of the plurality of test modes in accordance with a voltage of the external pad; and a circuit setting the first internal voltage in accordance with the first reference voltage; and a circuit setting the second internal voltage in accordance with the second reference voltage.

In the semiconductor memory device according to still another aspect of the present invention, the internal voltages supplied for the plurality of internal circuits are set in accordance with the voltage received from the external pad in response to the test mode. Therefore, analysis of the cause of malfunction in the burn-in test is facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
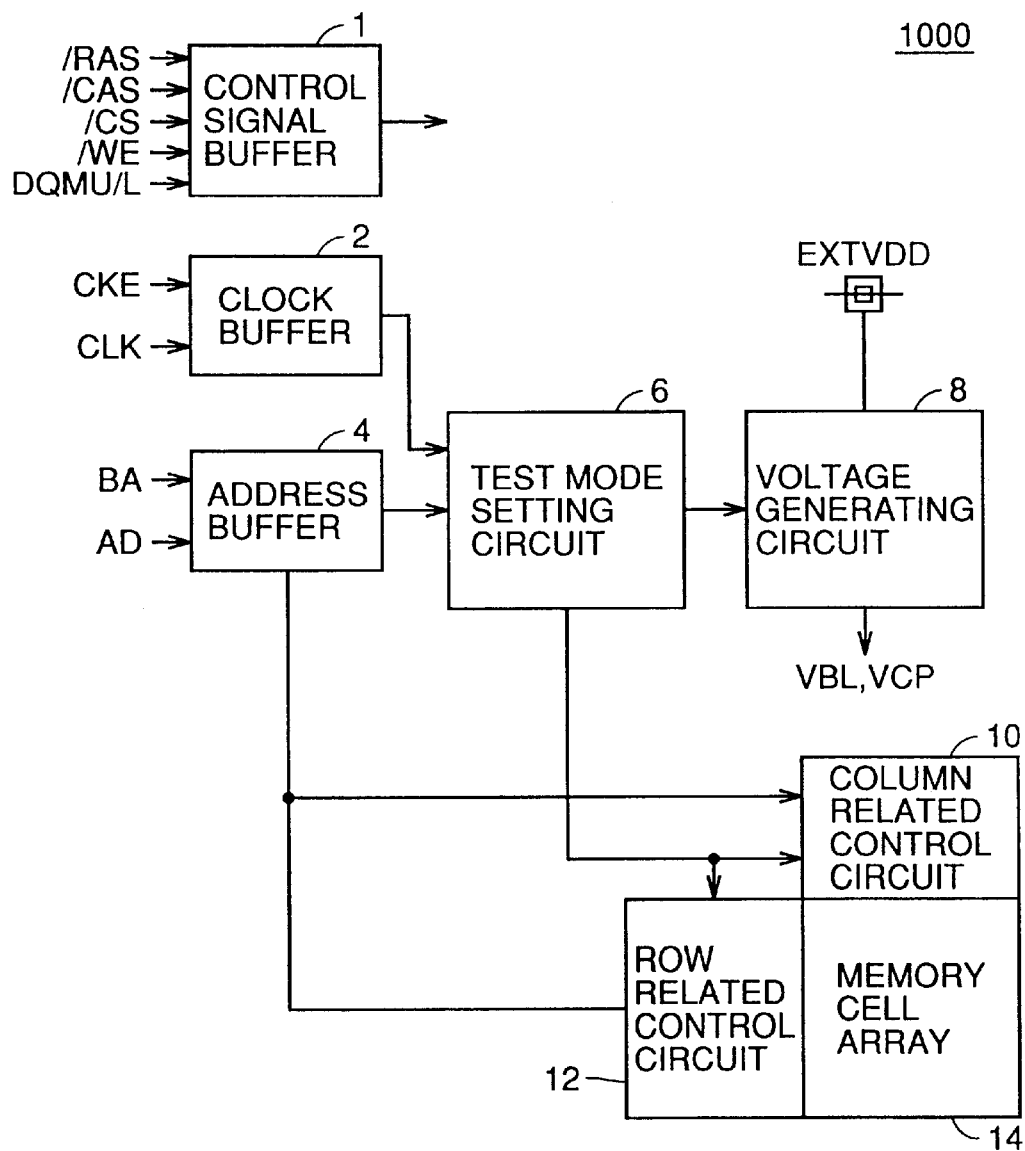
FIG. 1 is diagram showing an exemplary arrangement of a semiconductor memory device 1000 according to a first embodiment of the present invention.

Embodiments of the present invention will now be described in detail with reference to the drawings. It is noted that the same elements are denoted by the same reference numerals or characters, and description thereof will not be repeated.

First Embodiment

An exemplary arrangement of a semiconductor memory device 1000 according to a first embodiment of the present invention will be described with reference to FIG. 1. As shown in FIG. 1, semiconductor memory device 1000 includes: a control signal buffer 1 receiving external control signals (a row address strobe signal/RAS, column address strobe signal/CAS, chip select signal/CS, write enable signal/WE, DQMU/L signal and the like); a clock buffer 2 receiving an external clock CLK, clock enable signal CKE or the like; an address buffer 4 receiving a bank address BA and address AD; a test mode setting circuit 6 detecting a test mode for generating a test mode signal; a voltage generating circuit 8 generating an internal voltage; a memory cell array 14; a column related control circuit 10 performing column related control for the memory cell array; and a row related control circuit 12 performing row related control for the memory cell array.

Figure 2:
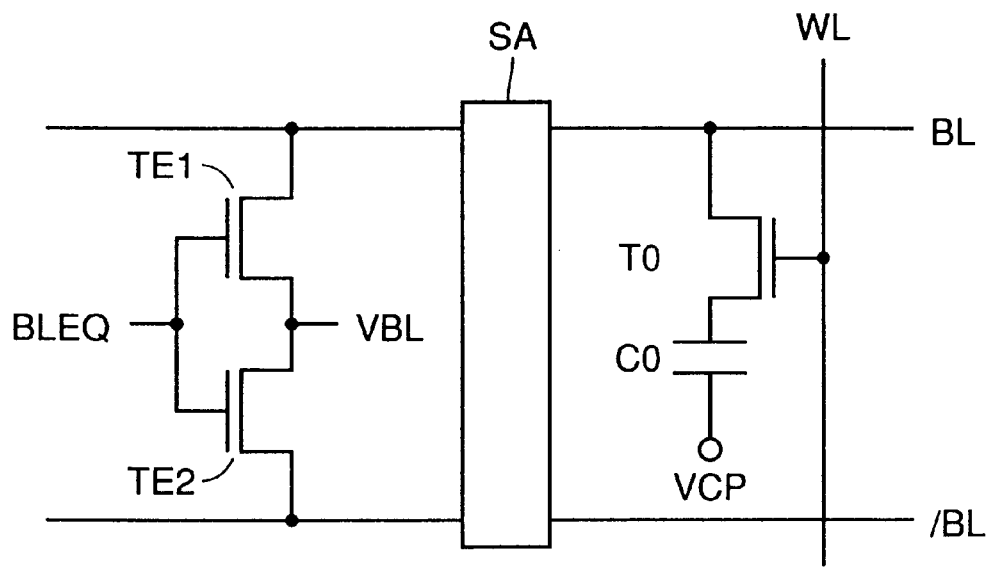
FIG. 2 is a diagram shown in conjunction with a memory cell, word line and bit line.

Memory cell array 14 includes a plurality of word lines arranged in a row direction, a plurality of bit lines arranged in a column direction, and a plurality of memory cells. As shown in FIG. 2, the memory cell includes: a memory cell capacitor C0 receiving a cell plate voltage VCP; and a memory cell transistor T0 connected between a bit line BL and a storage node of memory cell capacitor C0 and rendered conductive by a voltage of a word line WL. Connected to bit lines BL, /BL are a sense amplifier SA and transistors TE1, TE2. When transistors TE1, TE2 are rendered conductive by a signal BLEQ, voltages of bit lines BL, /BL turn to an equalization voltage VBL. It is noted that memory cell array 14 shown in FIG. 1 is divided into a plurality of banks.

Test mode setting circuit 6 shown in FIG. 1 first detects that the test mode is entered (entry) in accordance with an external signal. Then, when entry of the test mode is detected (test mode entry set), the test mode is set (test mode set).

Figure 3:
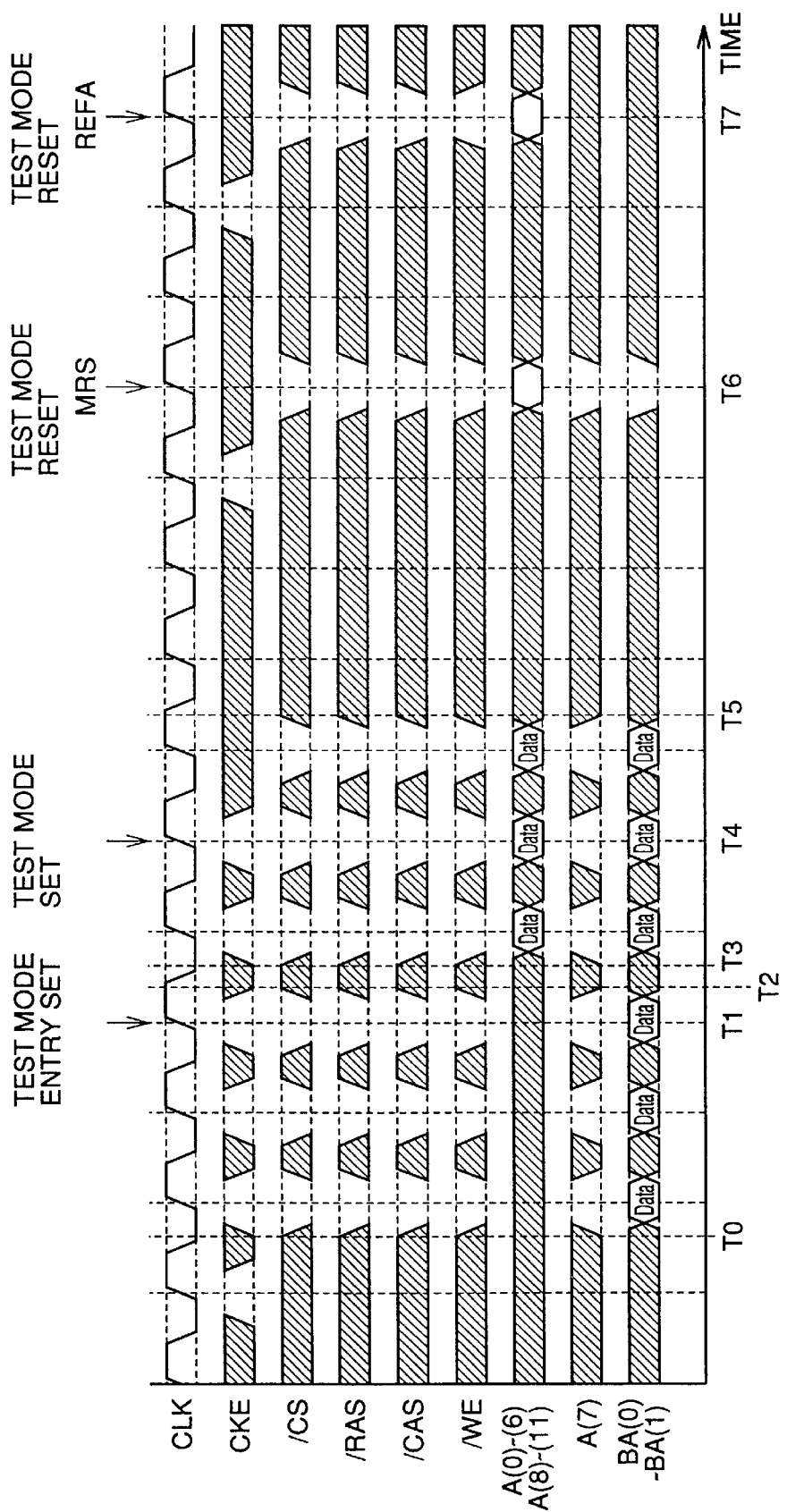
FIG. 3 is a timing chart shown in conjunction with an operation of a test mode setting circuit 6 according to the first embodiment of the present invention.

An operation of test mode setting circuit 6 will be described in detail with reference to FIG. 3. Referring to FIG. 3, for three cycles from times T0 to T2, entry of the test mode is detected by a combination of bank addresses BA(0) to (1) and addresses A(0) to (11) (test mode entry set; time T1). As a result, for three cycles from times T3 to T5, a corresponding test mode is set by a combination of bank addresses BA(0) to (1), addresses A(0) to (6) and (8) to (11) (test mode set; time T4). Test mode setting circuit 6 outputs a corresponding test mode signal.

Thus, the test mode is sequentially set. The test mode signals generated at the time are held by a latch circuit which is not shown in the drawing. Thus, a plurality of test modes are serially set by test mode setting circuit 6. It is noted that each test mode can be reset depending on a combination of input signals (T6, T7). Such test mode setting circuit 6 serially performs selection control for the word line and control of the internal voltage.

Figure 4:
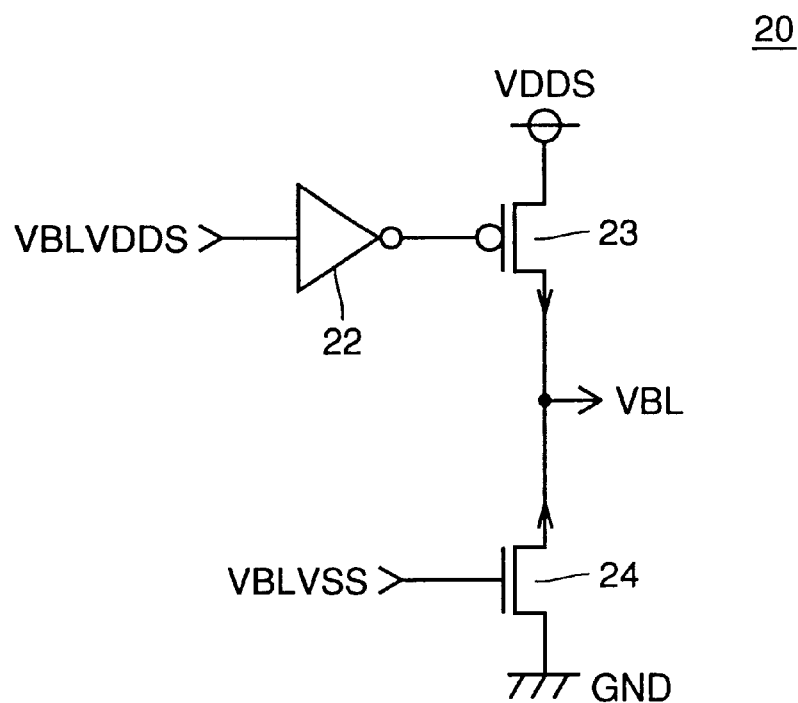
FIG. 4 is a diagram showing an exemplary arrangement of a main portion of a VBL generating circuit 20 included in a voltage generating circuit 8.

A voltage generating circuit 8 according to the first embodiment of the present invention will be described with reference to FIG. 4. FIG. 4 is a diagram showing an exemplary arrangement of a main portion of a VBL generating circuit 20 included in voltage generating circuit 8. Referring to FIG. 4, VBL generating circuit 20 sets equalization voltage VBL of the bit line to an internal power supply voltage VDDS or a ground voltage GND in accordance with test mode signals VBLVDDS and VBLVSS from test mode setting circuit 6. It is noted that internal power supply voltage VDDS is supplied from a circuit (not shown) decreasing an external power supply voltage EXTVDD.

VBL generating circuit 20 includes: an inverter 22 inverting test mode signal VBLVDDS; a PMOS transistor 23 having its gate receiving an output from inverter 22; and an NMOS transistor 24 having its gate receiving test mode signal VBLVSS. Transistors 23 and 24 are connected between internal power supply voltage VDDS and ground voltage GND. A voltage at a connecting node of transistors 23 and 24 turns to equalization voltage VBL.

When test mode signals VBLVDDS and VBLVSS respectively attain to H and L levels, transistor 23 is rendered conductive and equalization voltage VBL attains to the level of internal power supply voltage VDDS. When test mode signals VBLVDDS and VBLVSS respectively attain to the L and H levels, transistor 24 is rendered conductive and equalization voltage VBL attains to the level of ground voltage-GND. Equalization voltage VBL is hereinafter referred to as a VBL voltage.

It is noted that the VBL voltage is set at a fixed level (for example at the level half the VDDS) by a circuit which is not shown in the drawing when in a mode other than the prescribed test mode.

In other words, the VBL voltage is set higher (VDDS) or lower (GND) than the equalization voltage in the normal operation mode in accordance with the test mode.

Now, a method of driving the word line and bit line in the test mode will be described with reference to FIGS. 5 to 7. Voltage generating circuit 8, row related control circuit 12 and column related control circuit 10 write a checker pattern to the memory cell in the following procedure in accordance with the test mode detected by test mode setting circuit 6.

Figure 5:
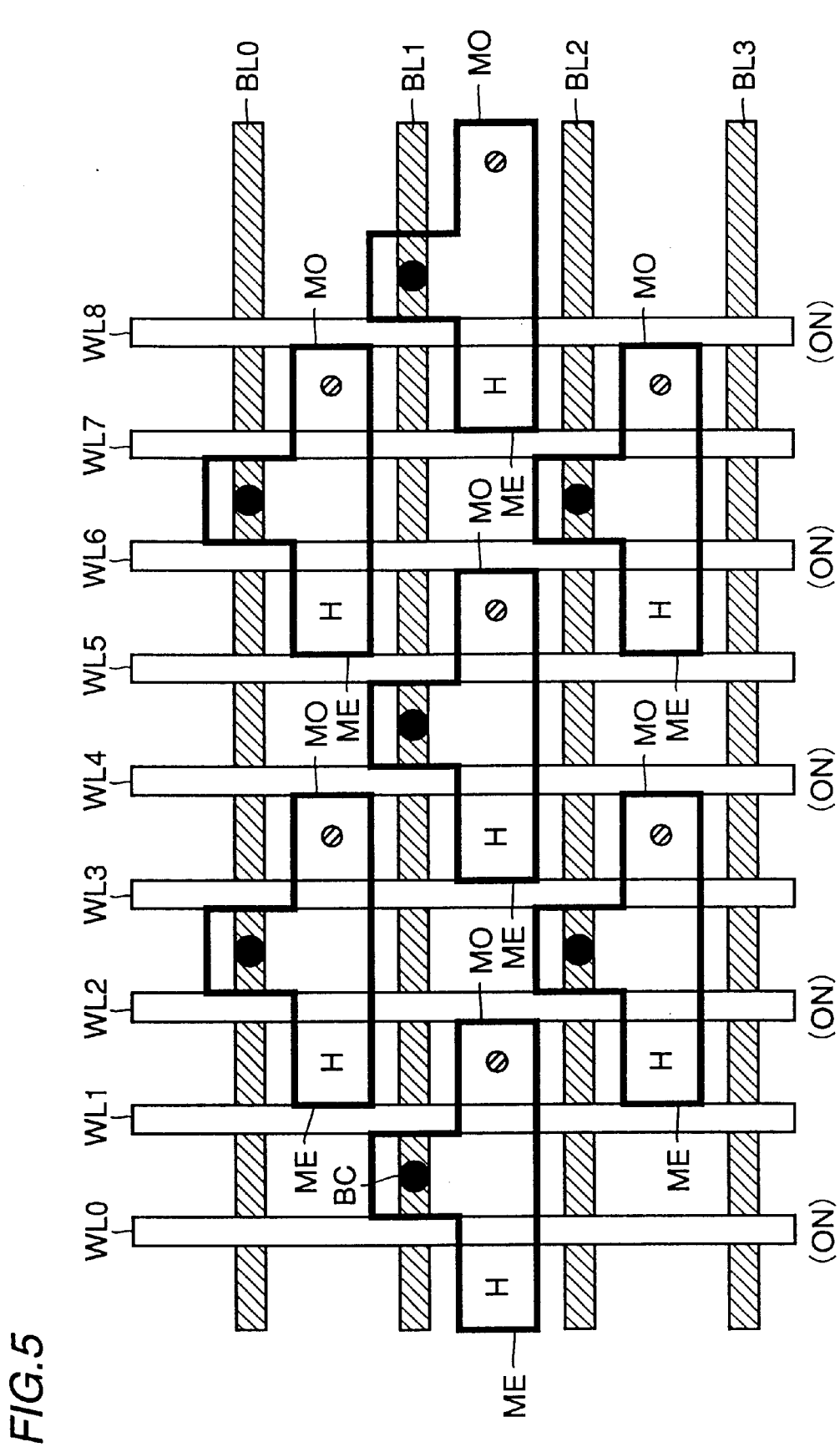
FIGS. 5 and 6 are schematic diagrams shown in conjunction with a method of driving the word line and bit line in the test mode.
Figure 6:
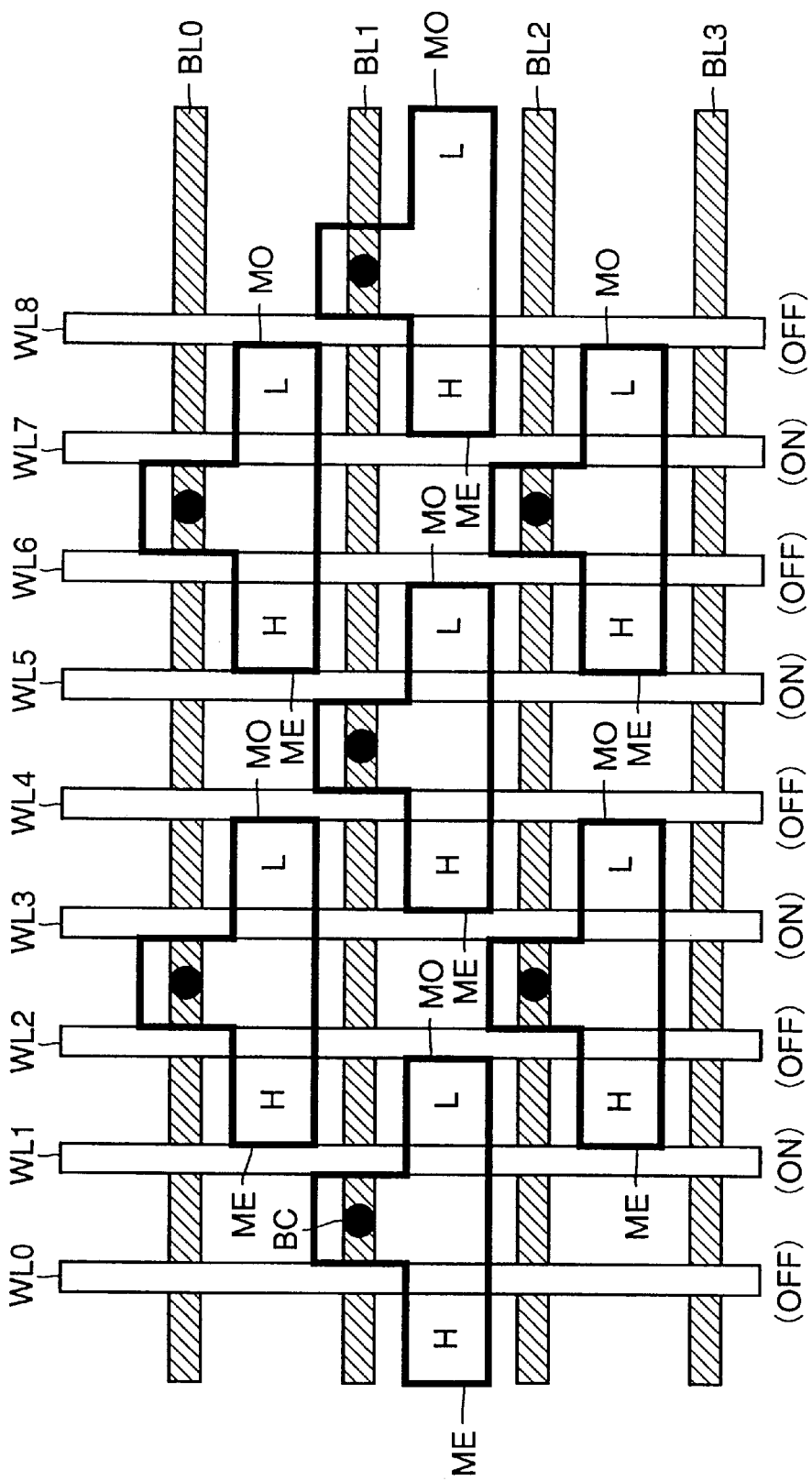

It is noted that characters ME and MO in FIGS. 5 and 6 respectively represent memory cells connected to even-numbered word lines WL0, WL2 and the like and those connected to odd-numbered word lines WL1, WL3 and the like. Character BC represents a bit line contact.

Figure 7:
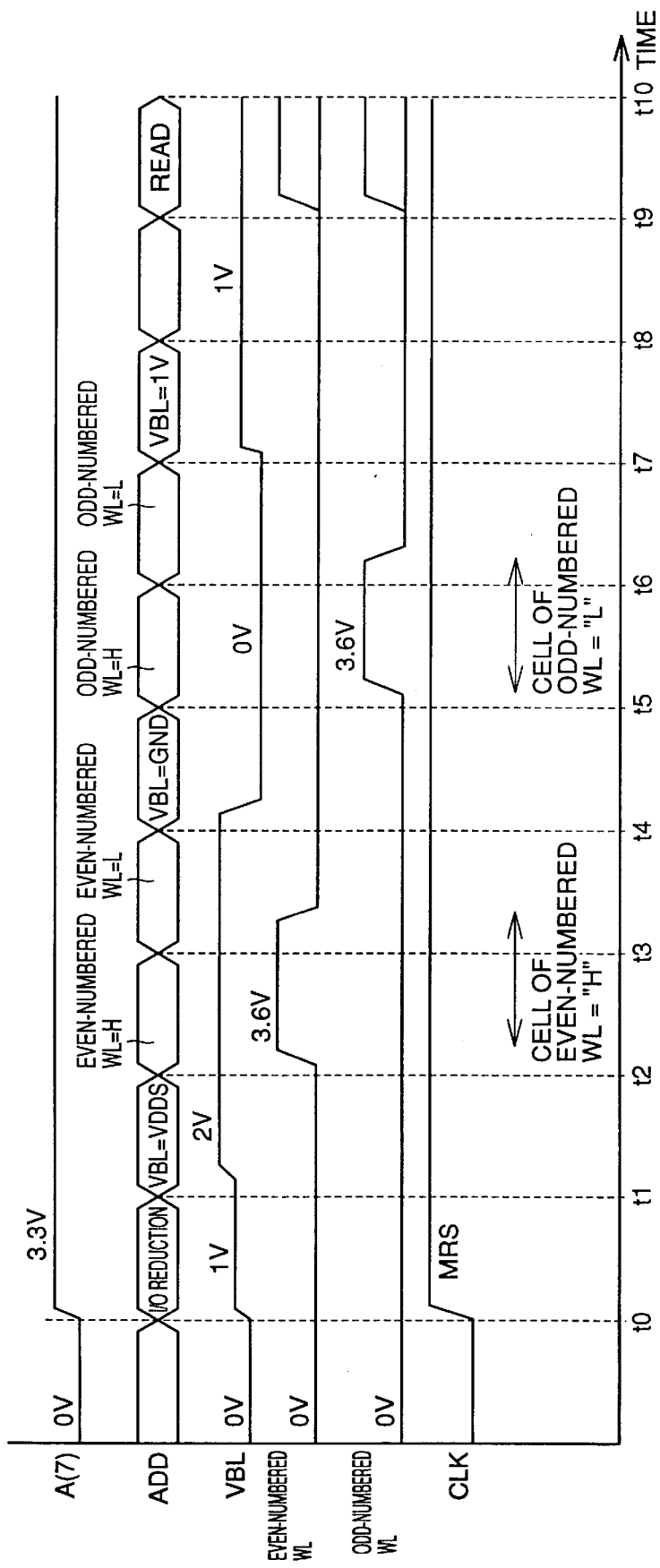
FIG. 7 is a timing chart shown in conjunction with the method of driving the word line and bit line in the test mode.

It is shown in FIG. 7 that the test mode is set by a combination of address A(7) at the H level and the other address ADD.

Referring to FIG. 7, at a time to, specific address A(7) is set at the H level (3.3V), the other address ADD is set to a prescribed value, and a clock CLK is risen. A mode register (not shown) is set (MRS). From t0 to t1, an IO reduction mode is set. For the time, the VBL voltage attains to a general voltage level (1V).

From time t1 to t2, VBL generating circuit 20 is operated. Thus, the VBL voltage attains to internal power supply voltage VDDS (2V). The voltage of the bit line increases.

From time t2 to t3, every other word lines are brought into the selection state (3.6V) in a physical arrangement. More specifically, even-numbered word lines WL0, WL2, WL4, WL6 and WL8 are selected (ON; H level). Thus, data (H) is written to a memory cell ME connected to the even-numbered word line (see FIG. 5). From time t3 to t4, even-numbered word lines WL0, WL2, WL4, WL6 and WL8 are brought into the non-selection state (L level).

From time t4 to t5, VBL generating circuit 20 is operated. Thus, the VBL voltage attains to ground voltage GND (0V). The voltage of the bit line decreases.

From time t5 to t6, the state of the word lines is changed. More specifically, odd-numbered word lines WL1, WL3, WL5 and WL7 are brought into the selection state (ON; H level). Thus, data (L) is written to memory cell MO connected to the odd-numbered word line (see FIG. 6). For that time, the even-numbered word lines are in the non-selection state (OFF). From time t6 to t7, odd-numbered word lines WL1, WL3, WL5 and WL7 are brought into the non-selection state (L level).

From time t7 to t8, the VBL voltage is returned to a general voltage level (1V). From time t9 to t10, information for the even-numbered word line is compressed (IO reduction) and read.

Thus, the change in the state of the even/odd-numbered word lines and the voltage control for the bit line enable a checker pattern with the adjacent memory cells storing different information to be written. If a small leakage current is generated in a certain memory cell, a potential of the adjacent memory cell leaks (the stored data is lost). If it is detected, the defective memory cell can be detected.

As described above, the semiconductor memory device according to the first embodiment of the present invention sequentially performs the selection control for the word line and the voltage control for the bit line by a plurality of test modes serially set in accordance with the external signal. Thus, even in a molded state, the checker pattern can efficiently be written in a short period of time.

Second Embodiment

Figure 8:
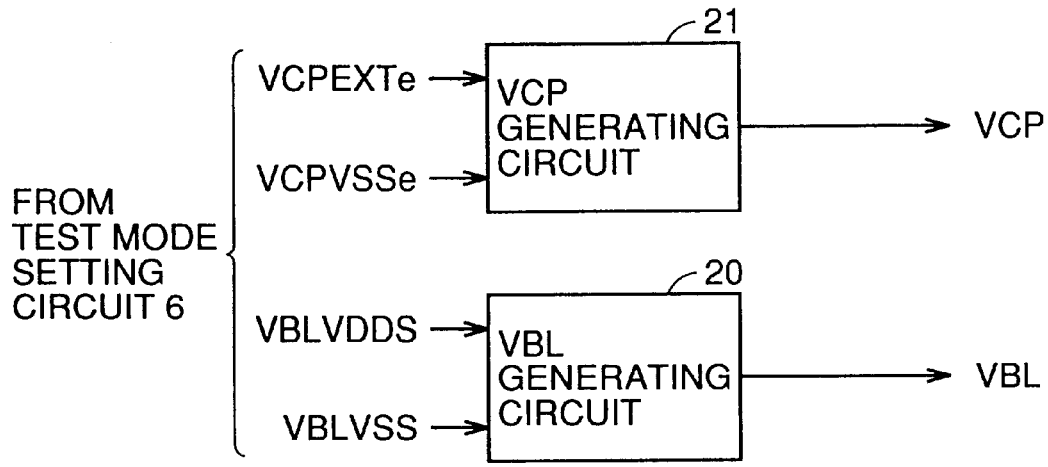
FIG. 8 is a diagram showing an exemplary arrangement of a voltage generating circuit according to a second embodiment of the present invention.

A second embodiment of the present invention relates to another exemplary arrangement of voltage generating circuit 8. FIG. 8 is a diagram showing an exemplary arrangement of the voltage generating circuit according to the second embodiment of the present invention. As shown in FIG. 8, the voltage generating circuit includes; a VBL generating circuit 20; and a VCP generating circuit 21 setting a cell plate voltage of a memory cell capacitor in accordance with an output from mode setting circuit 6. VBL generating circuit 20 is as described in the first embodiment.

Figure 9:
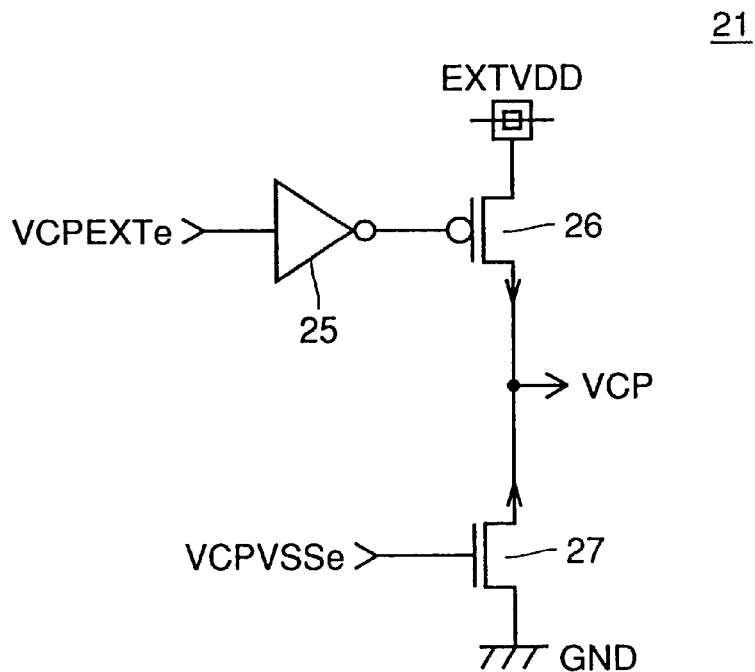
FIG. 9 is a diagram showing an exemplary arrangement of a main portion of a VCP generating circuit 21.

An exemplary arrangement of a main portion of VCP generating circuit 21 will be described with reference to FIG. 9. FIG. 9 is a diagram showing an exemplary arrangement of a main portion of VCP generating circuit 21. Referring to FIG. 9, VCP generating circuit 21 includes: an inverter 25 inverting a test mode signal VCPEXTe; a PMOS transistor 26 having its gate receiving an output from inverter 25; and an NMOS transistor 27 having its gate receiving a test mode signal VCPVSSe.

Transistors 26 and 27 are connected between an external power supply voltage EXTVDD and a ground voltage GND. A voltage at a connecting node of transistors 26 and 27 is a cell plate voltage VCP.

When test mode signals VCPEXTe and VCPVSSe are respectively set at H and L levels, transistor 26 is rendered conductive and cell plate voltage VCP attains to external power supply voltage EXTVDD level. When test mode signals VCPEXTe and VCPVSSe are respectively set at the L and H levels, transistor 27 is rendered conductive and cell plate voltage VCP attains to ground voltage GND level.

It is noted that the VCP voltage is set at a fixed level (for example at the level half the VDDS) by a circuit which is not shown in the drawing, when in a mode other than a prescribed test mode.

In a burn-in test (for example in a test by the checker pattern described in the first embodiment), the voltage for the cell plate of the memory cell is set higher (power supply voltage EXTVDD) or lower (ground voltage GND) than a voltage in a normal operation mode by VCP generating circuit 21. Thus, an electrical stress applied to the memory cell increases. As a result, the burn-in is accelerated, so that a defective memory cell can be detected in a short period of time.

Third Embodiment

Figure 10:
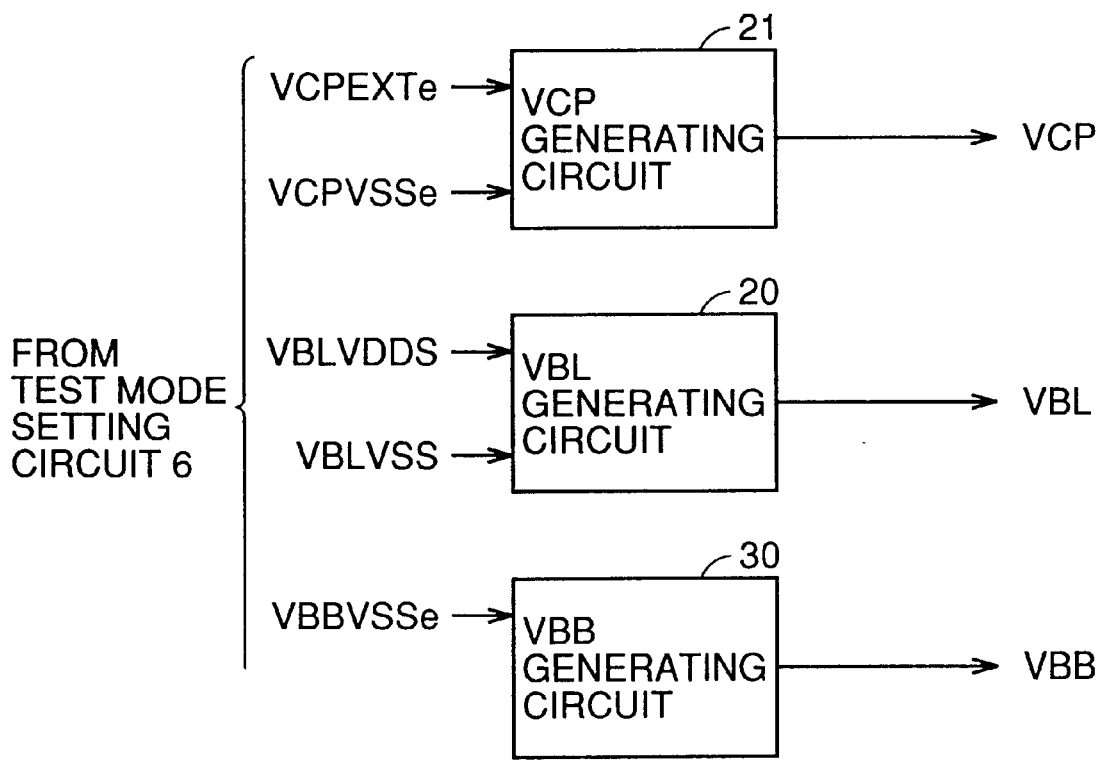
FIG. 10 is a diagram showing an exemplary arrangement of a voltage generating circuit according to a third embodiment of the present invention.

A third embodiment of the present invention is provided with a voltage generating circuit shown in FIG. 10 in place of the circuit shown in FIG. 4. An exemplary arrangement of the voltage generating circuit according to the third embodiment of the present invention will be described with reference to FIG. 10. Referring to FIG. 10, the voltage generating circuit includes VBL generating circuit 20, VCP generating circuit 21 and VBB generating circuit 30 operating in accordance with a test mode signal. VBL generating circuit 20 and VCP generating circuit 21 are the same as those described in the first and second embodiments.

VBB generating circuit 30 sets a VBB voltage, which is one of the internal voltages, in accordance with test mode signal VBBVSSe received from test mode setting circuit 6. The VBB voltage turns to a back gate voltage (a voltage for a well directly below a gate) of a memory cell transistor.

Figure 11:
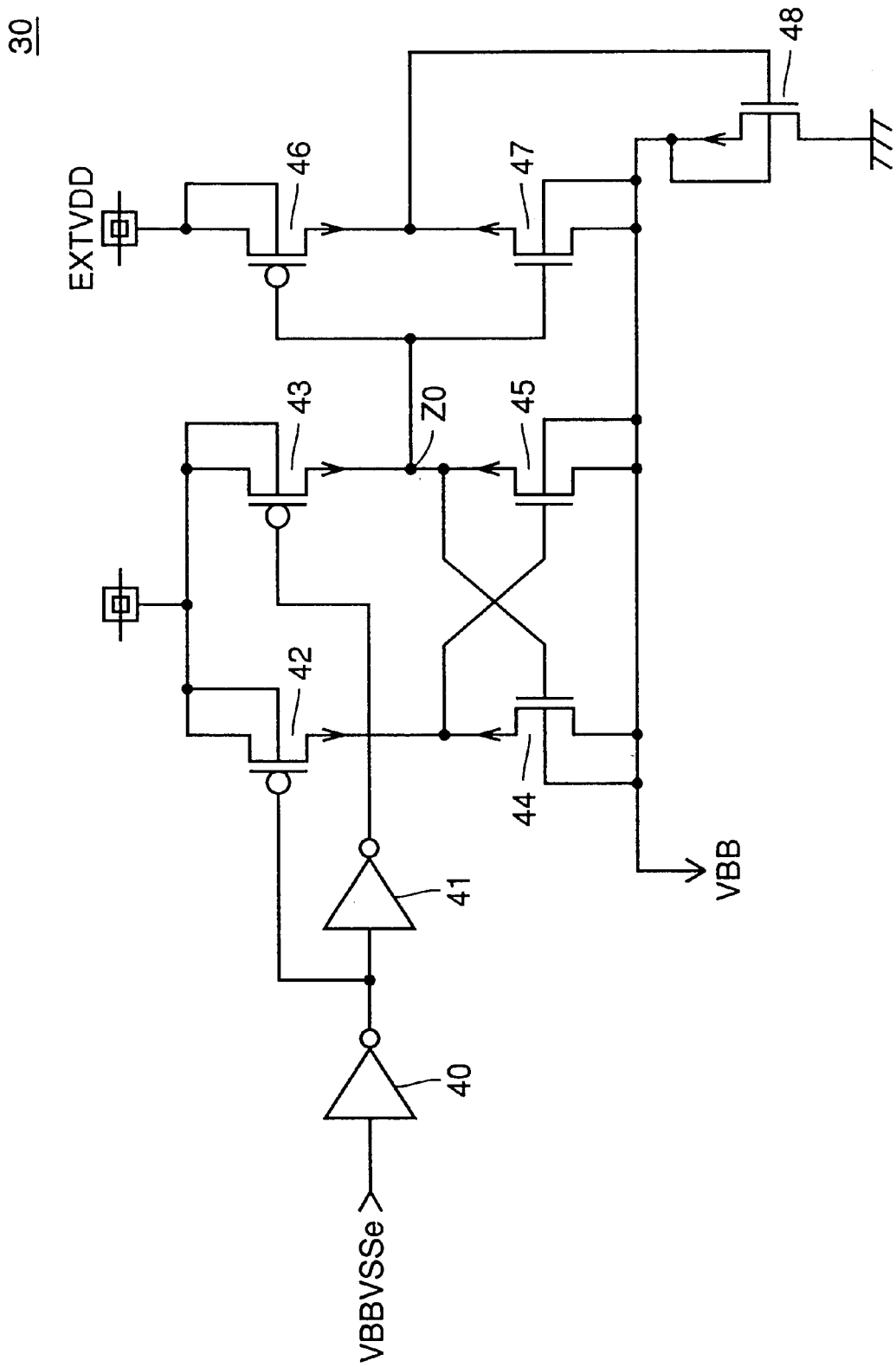
FIG. 11 is a diagram showing an exemplary arrangement of a VBB generating circuit 30.

An exemplary arrangement of VBB generating circuit 30 will be described with reference to FIG. 11. FIG. 11 is a diagram showing the exemplary arrangement of VBB generating circuit 30. As shown in FIG. 11, VBB generating circuit 30 includes inverters 40 and 41 and transistors 42 to 48. Transistors 42, 43 and 46 are PMOS transistors, whereas transistors 44, 45, 47 and 48 are NMOS transistors.

Transistors 42 and 43 are connected to external power supply voltage EXTVDD. Inverter 40 inverts test mode signal VBBVSSe, and inverter 41 inverts an output from inverter 40. Transistors 42 and 43 have their gates respectively connected to outputs from inverters 40 and 41. Transistor 44 is connected between transistor 42 and a VBB node supplying the VBB voltage, and has its gate connected to a node Z0 (a connecting node between transistors 43 and 45). Transistor 45 is connected between transistor 43 and the VBB node, and has its gate connected to a connecting node between transistors 42 and 44.

Transistors 46 and 47 are connected between a pad receiving external power supply voltage EXTVDD and the VBB node, and have their gates both connected to node Z0. Transistor 48 connected between the VBB node and ground voltage GND is rendered conductive in accordance with a voltage of the connecting node between transistors 46 and 47.

When test mode signal VBBVSSe is set at the H level, the VBB voltage, which is the voltage of the VBB node, attains to the ground voltage GND level. When test mode signal VBBVSSe is set at the L level, the VBB voltage is brought in a floating state.

A generally used VBB generating circuit which is not shown in the drawing sets the VBB voltage in accordance with external power supply voltage EXTVDD. When the circuit (not shown) is used, if external power supply voltage EXTVDD is increased in the burn-in test, the VBB voltage decreases (a back gate voltage of the memory cell decreases). If the VBB voltage decreases, a junction voltage which is higher than that in general use in supplied to a PN junction of the memory cell transistor, possibly destroying the junction portion (a leakage of electric charges). In this case, the defective memory cell cannot be appropriately detected.

Therefore, in the third embodiment of the present invention, when the above described checker pattern is written, for example, the back gate voltage (the VBB voltage) is fixed at ground voltage GND by VBB generating circuit 30. Thus, any damage due to the stress undesirebly applied to the PN junction of the memory cell transistor is avoided. As a result, the defective memory cell can suitably be detected.

Fourth Embodiment

Figure 12:
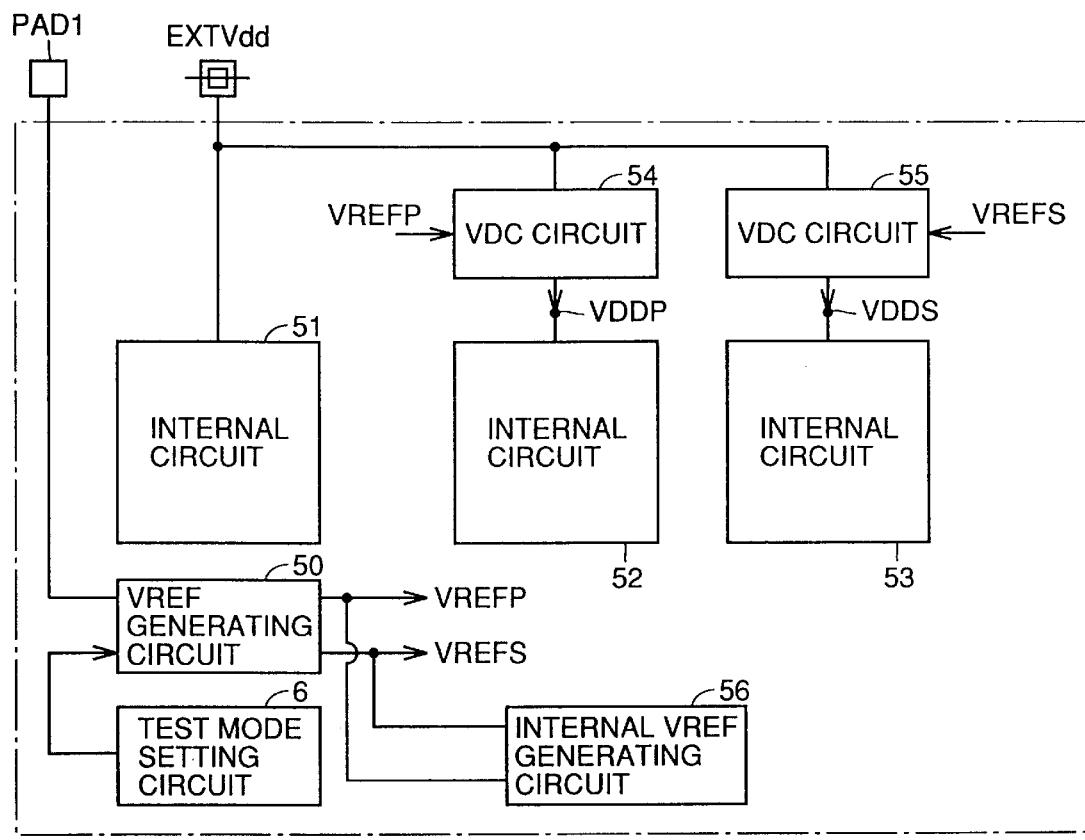
FIG. 12 is a schematic diagram showing an arrangement of a semiconductor memory device according to a fourth embodiment of the present invention.

An overall structure of a semiconductor memory device according to a fourth embodiment of the present invention will be described with reference to FIG. 12. The semiconductor memory device shown in FIG. 12 includes internal circuits 51, 52, 53, a test mode setting circuit 6, a VREF generating circuit 50, VDC circuits 54, 55 and an internal VREF generating circuit 56.

Internal circuit 51 receives external power supply voltage EXTVDD for operation and, for example, is a circuit externally outputting data which has been read from the memory cell. Internal circuit 52 receives the VDDP voltage output from VDC circuit 54 for operation and, for example, is a peripheral circuit. The peripheral circuit includes a circuit related to selection of the memory cell array, a circuit transmitting/receiving data to/from the memory cell or the like. Internal circuit 53 receives the VDDS voltage output from VDC circuit 55 for operation and, for example, includes a memory cell array, sense amplifier or the like.

VDC circuit 54 decreases the VREFP voltage and outputs the VDDP voltage. VDC circuit 55 decreases the VREFS voltage and outputs the VDDS voltage.

VREF generating circuit 50 is connected to an external pad PAD 1, and sets the VREFP and VREFS voltages to prescribed values in accordance with an output from test mode setting circuit 6.

Internal VREF generating circuit 56 internally generates the VREFP and VREFS voltages at prescribed values.

Therefore, although the VDDS and VDDP voltages are generally set at the prescribed values by internal VREF generating circuit 56, in a prescribed test mode, they are changed in accordance with an externally applied voltage.

Figure 13:
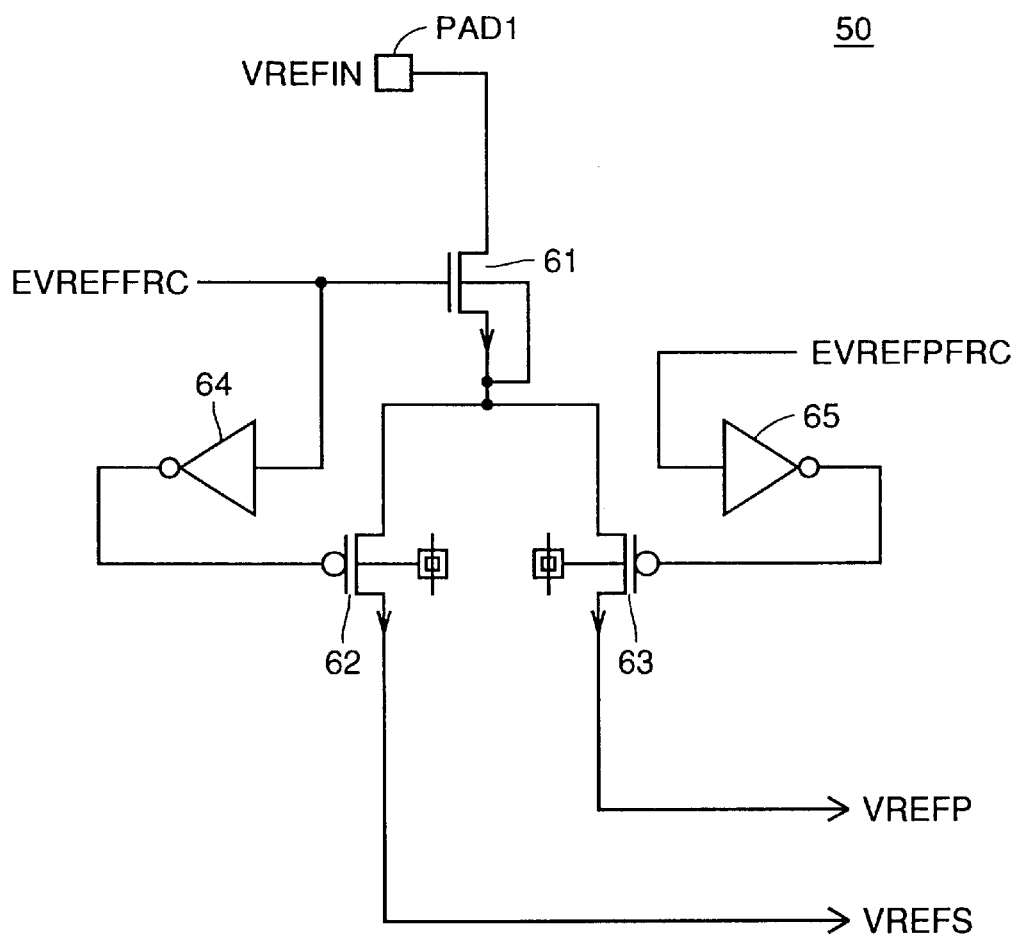
FIG. 13 is a diagram showing an exemplary arrangement of a VREF generating circuit 50.

An exemplary arrangement of a main portion of VREF generating circuit 50 will be described with reference to FIG. 13. FIG. 13 is a diagram showing an exemplary arrangement of VREF generating circuit 50. As shown in FIG. 13, VREF generating circuit 50 includes inverters 64, 65 and transistors 61, 62, 63. Transistor 61 is an NMOS transistor, whereas transistors 62 and 63 are PMOS transistors.

A gate of transistor 61 and inverter 64 receive signals EVREFFRC output from test mode setting circuit 6. Inverter 65 receives signal EVREFPFRC output from test mode setting circuit 6. Transistor 62 has its gate receiving an output from inverter 64, whereas transistor 63 has its gate receiving an output from inverter 65.

Transistor 61 is connected between external pad PAD 1 and one conductive terminals of transistors 62 and 63. The voltages of the other conductive terminals of transistors 62 and 63 respectively turn to the VREFS and VREFP voltages.

A voltage VREFIN is supplied from external pad PAD 1. When signals EVREFFRC and EVREFPFRC are respectively set at the H and L levels, transistors 61 and 62 are rendered conductive. Thus, the VREFS voltage turns to a value in accordance with a voltage supplied from external pad PAD 1. When signals EVREFFRC and EVREFPFRC are both set at the H level, transistors 61, 62 and 63 are rendered conductive. Thus, the VREFS and VREFP voltages attain to values in accordance with the voltage supplied from external pad PAD 1.

Figure 14:
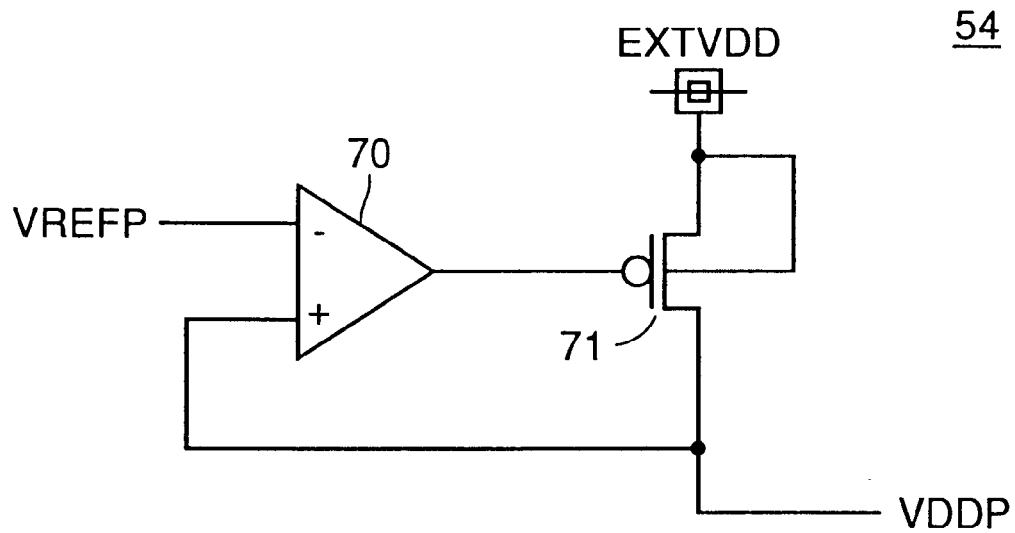
FIG. 14 is a diagram showing an exemplary arrangement of a VDC circuit 54 generating a VDDP voltage.

An exemplary structure of VDC circuit 54 generating the VDDP voltage will be described with reference to FIG. 14. As shown in FIG. 14, VDC circuit 54 includes a comparator 70 and a PMOS transistor 71. Comparator 70 compares the VDDP voltage and the VREFP voltage. Transistor 71 is connected between external power supply voltage EXTVDD and a VDDP node supplying the VDDP voltage, and has its gate connected to an output from comparator 70. VDC circuit 54 determines the level of the VDDP voltage in accordance with the VREFP voltage.

It is noted that the VDDP voltage is set at a fixed level (for example at 2.5V) in accordance with an output from internal VREF generating circuit 56 when in a mode other than a prescribed test mode.

Figure 15:
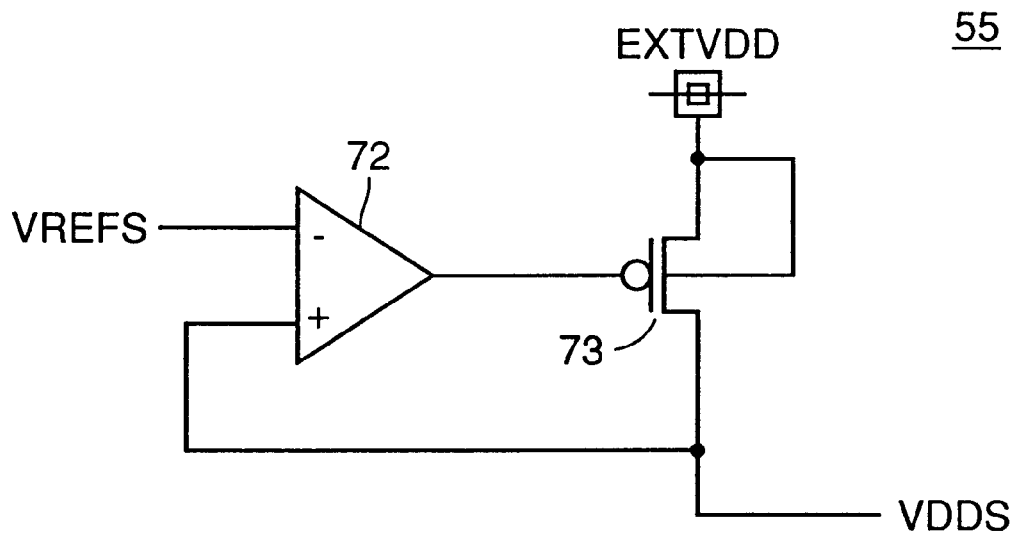
FIG. 15 is a diagram showing an exemplary arrangement of a VDC circuit 55 generating a VDDS voltage.

An exemplary structure of VDC circuit 55 generating the VDDS voltage will be described with reference to FIG. 15. As shown in FIG. 15, VDC circuit 55 includes a comparator 72 and a PMOS transistor 73. Comparator 72 compares the VDDS voltage and the VREFS voltage. Transistor 73 is connected between external power supply voltage EXTVDD and the VDDS node supplying the VDDS voltage, and has its gate connected to an output from comparator 72. VDC circuit 55 determines the level of the VDDS voltage in accordance with the VREFS voltage.

It is noted that the VDDS voltage is set at a fixed level (for example at 2V) in accordance with an output from internal VREF generating circuit 56 when in a mode other than a prescribed test mode.

Such structure enables the voltage supplied for internal circuits 52 and 53 to be changed in accordance with the voltage of the external pad in response to the test mode (a test mode signal) set by test mode setting circuit 6. As a result, in the burn-in test, stress can be separately applied to the peripheral circuit and the memory cell array/sense amplifier. Therefore, analysis of the cause of malfunction is facilitated.

Fifth Embodiment

A voltage generating circuit according to a fifth embodiment of the present invention will be described. The voltage generating circuit according to the fifth embodiment of the present invention stops an operation of the generator generating an internal voltage in a test mode and, alternatively, generates a fixed voltage or a voltage in accordance with a voltage of an external pad.

Figure 16:
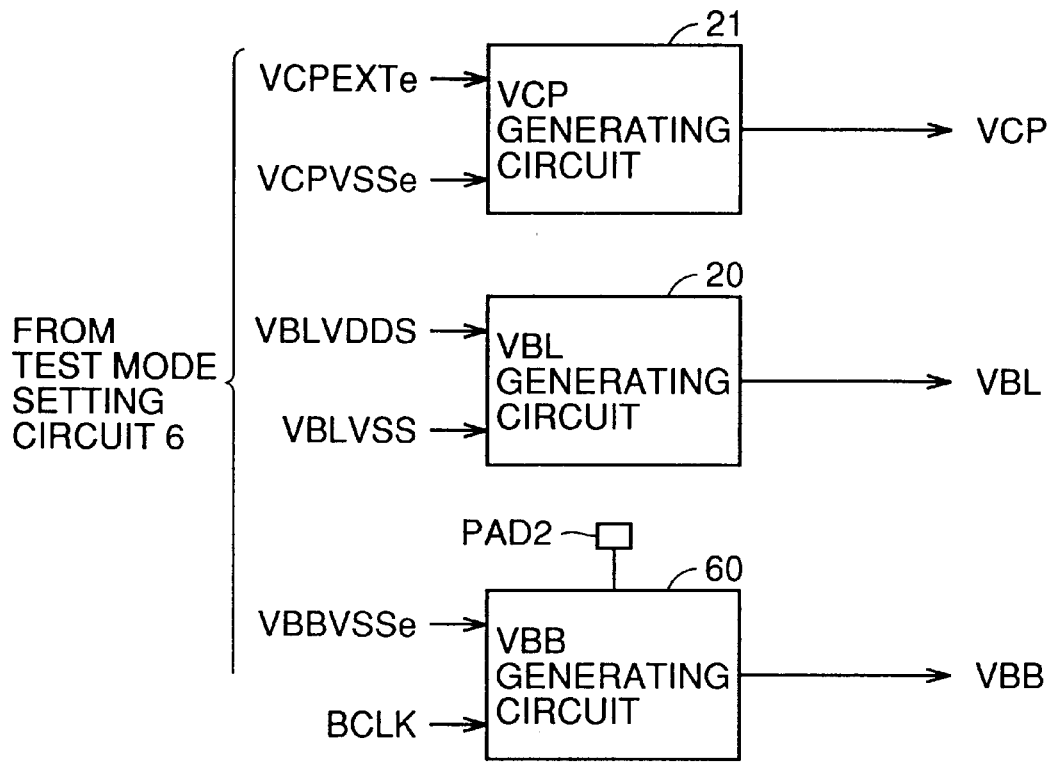
FIG. 16 is a diagram showing an exemplary arrangement of a main portion of a voltage generating circuit according to a fifth embodiment of the present invention.

An exemplary structure of a main portion of the voltage generating circuit according to the fifth embodiment of the present invention will be described with reference to FIG. 16. As shown in FIG. 16, the voltage generating circuit includes a VBL generating circuit 20, VCP generating circuit 21 and VBB generating circuit 60. VBL generating circuit 20 and VCP generating circuit 21 are the same as those described in the first and second embodiments.

VBB generating circuit 60 sets a VBB voltage, which is one of internal voltages, in accordance with a BCLK signal and a test mode signal VBBVSSe received from test mode setting circuit 6. As described above, the VBB voltage determines a back gate voltage of the memory cell transistor.

Figure 17:
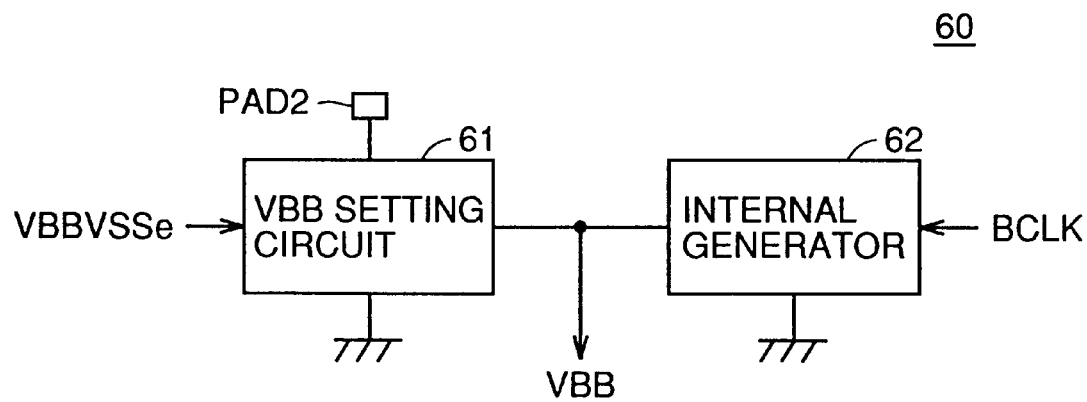
FIG. 17 is a diagram showing an exemplary arrangement of a VBB generating circuit 60.

An exemplary structure of VBB generating circuit 60 will be described with reference to FIG. 17. As shown in FIG. 17, VBB generating circuit 60 includes a VBB setting circuit 61 and internal generator 62. VBB setting circuit 61 sets the VBB voltage at ground voltage GND or a voltage of an external pad PAD 2 in accordance with test mode signal VBBVSSe. Internal generator 62 internally generates a voltage in accordance with the BCLK signal.

Figure 18:
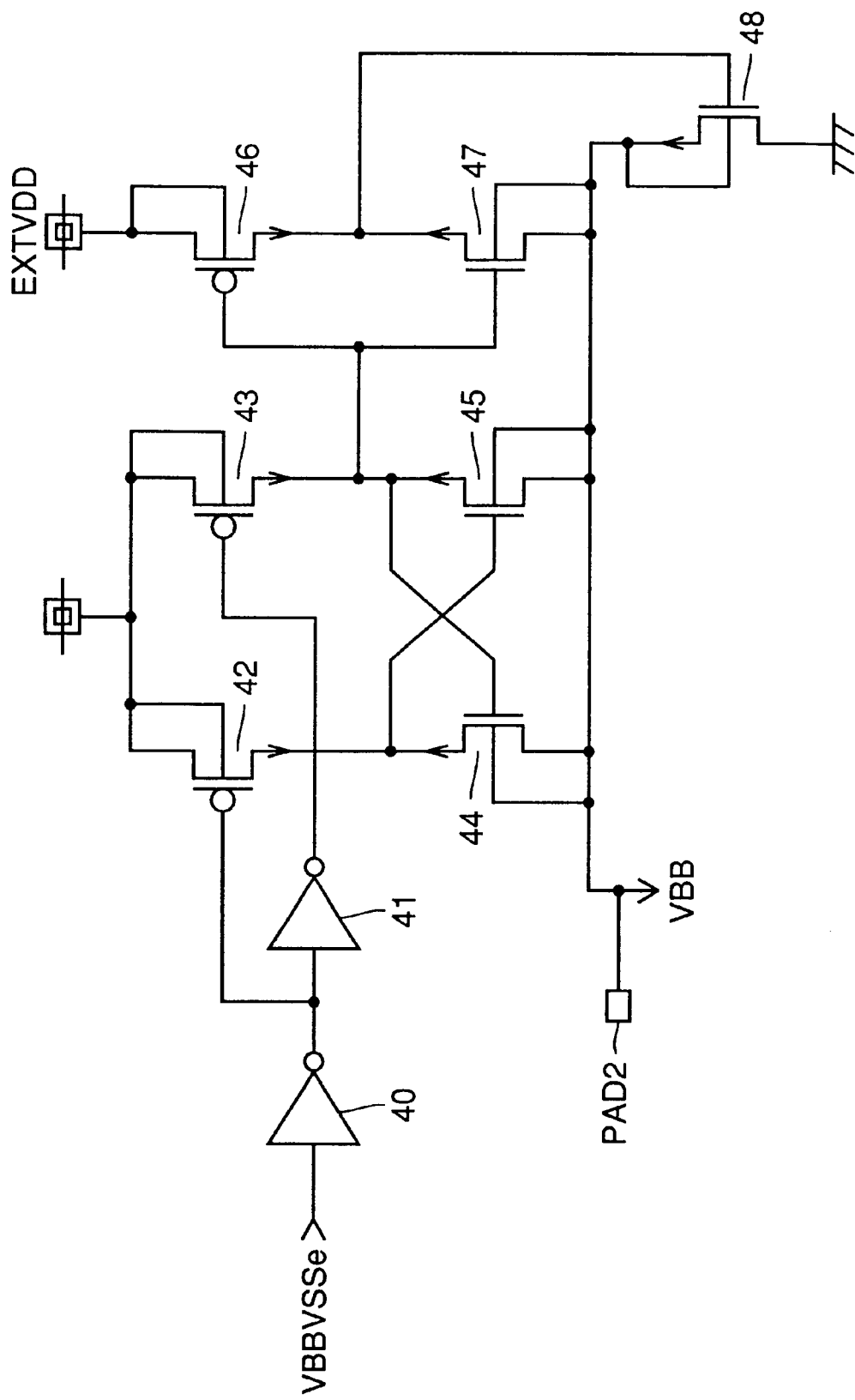
FIG. 18 is a diagram showing an exemplary arrangement of a VBB setting circuit 61.

An exemplary structure of VBB setting circuit 61 will be described with reference to FIG. 18. As shown in FIG. 18, VBB setting circuit 61 includes inverters 40, 41 and transistors 42 to 48. These are connected as described in the third embodiment.

In the fifth embodiment, external pad PAD 2 is connected to the VBB node. When test mode signal VBBVSSe is set at the H level, the VBB voltage, the voltage of the VBB node, attains to the ground voltage GND level. When test mode signal VBBVSSe is set at the L level, the VBB voltage changes with the voltage of external pad PAD 2.

Figure 19:
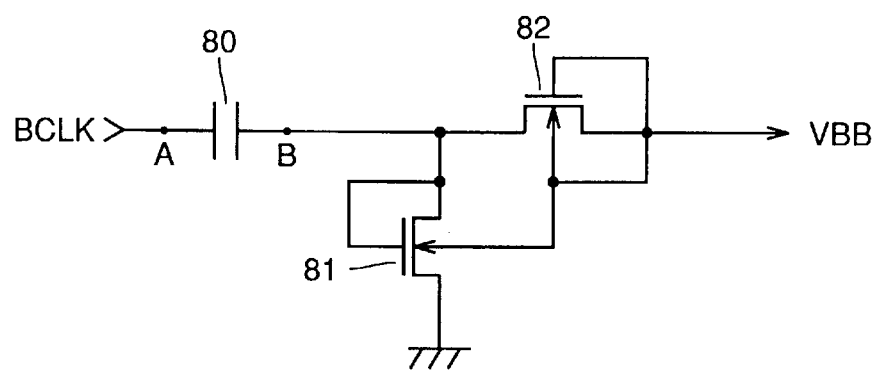
FIG. 19 is a diagram showing an exemplary arrangement of an internal generator 62.
Figure 20A:
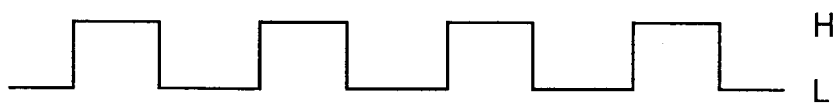
FIGS. 20A and 20B are timing charts shown in conjunction with a BCLK signal received by internal generator 62.
Figure 20B:
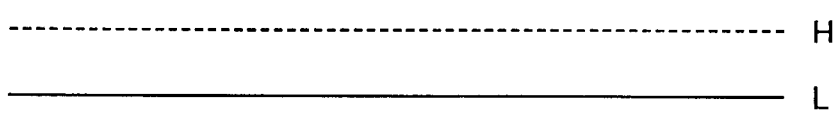

An exemplary structure of internal generator 62 will be described with reference to FIG. 19. As shown in FIG. 19, internal generator 62 includes a capacitor 80 and transistors 81, 82. One electrode of capacitor 80 receives the BLCK signal. Transistor 81 is connected between the other electrode of capacitor 80 and a ground voltage, whereas transistor 82 is connected between the other electrode of capacitor 80 and the VBB node. As shown in FIGS. 20A and 20B, the BCLK signal is a pulse signal having a prescribed period in a normal operation mode, and may have internal voltage VDD or ground voltage GND. The BCLK signal is fixed at the L level when the specific test mode is set by the above described test mode setting circuit 6.

Figure 21:
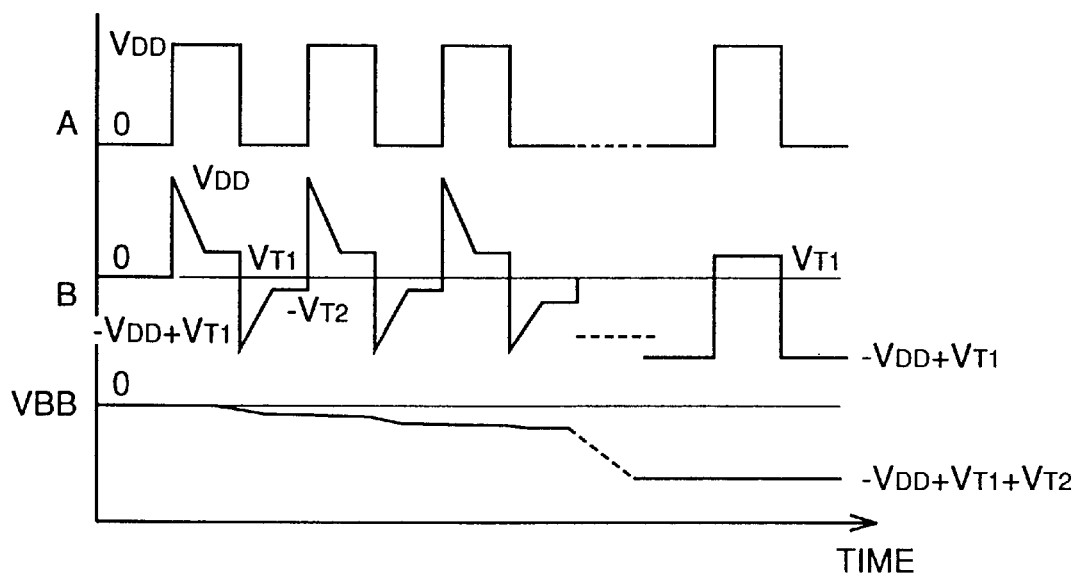
FIG. 21 is a timing chart shown in conjunction with an operation of internal generator 62.

An operation of internal generator 62 will be described with reference to FIG. 21. Referring to FIG. 21, characters A and B respectively represent nodes on one electrode side receiving the BCLK signal and the other electrode side of capacitor 80. In addition, VT1 and VT2 represent threshold value voltages of the transistor. When the BCLK signal alternately attains to the H (internal power supply voltage VDD) and L (ground voltage GND) level, a voltage of a node B decreases by a pumping operation of capacitor 80. Thus, the VBB voltage attains to a prescribed value (−VDD+VT1+VT2), for example at (−1)V. It is noted that internal power supply voltage VDD is supplied from a circuit (not shown) decreasing external power supply voltage EXTVDD.

Thus, upon entering the test mode setting the BCLK signal at the L level, internal generator 62 stops and the VBB voltage is brought into a floating state. Thereafter, upon entering a burn-in test mode, the VBB voltage attains to the voltage of the external pad or ground voltage GND.

It is noted that although the VBB generating circuit has been exemplified in the above, the same is applied to the VCP generating circuit, VBL generating circuit or the like. In this case, a generator (a generally used circuit) included in the VCP generating circuit, VBL generating circuit or the like is stopped such that the output voltage is brought into the floating state and, upon entering the burn-in test mode, turns to the voltage from the external pad or the fixed voltage.

The VPP voltage supplied for the word line is increased when the stress is applied to the word line. However, also for the circuit generating the VPP voltage, the operation thereof is stopped or fixed in a specific test mode and the voltage is set to the voltage from the external pad with a similar structure.

Such structure prevents stress from being applied to the portion other than the memory cell in the burn-in test. In addition, as control of the internal power supply voltage and that of the word line are separately performed in the burn-in test, in the case of malfunction, it is readily determined if a circuit related to the internal power supply voltage, or the control of the word line per se has the problem.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of memory cells arranged in a matrix, a plurality of word lines arranged correspondingly to rows of said plurality of memory cells and a plurality of bit lines arranged correspondingly to columns of said plurality of memory cells;
   a test mode setting circuit serially setting a plurality of test modes in accordance with an external signal; and
   a memory control circuit writing a checker pattern to said memory cell array in accordance with an output from said test mode setting circuit, said memory control circuit including:
      a row control circuit bringing even-numbered word lines/odd-numbered word lines of said plurality of word lines into a selection/non-selection state in accordance with corresponding one of said plurality of test modes; and
      a column control circuit setting a voltage of said plurality of bit lines for supplying it to said plurality of bit lines in accordance with said corresponding one of said plurality of test modes.

2. The semiconductor memory device according to claim 1, wherein said memory control circuit serially performs selection control for said even-numbered word lines or said odd-numbered word lines and voltage control for said plurality of bit lines for writing data at different potentials to memory cells corresponding to said even-numbered word line and said odd-numbered word line.

3. The semiconductor memory device according to claim 2, wherein said column control circuit includes a circuit determining said voltage of said plurality of bit lines as a voltage higher than or lower than an equalization voltage in a normal operation mode in accordance with said corresponding one of said plurality of test modes.

4. The semiconductor memory device according to claim 3, wherein each of said plurality of memory cells includes a memory cell capacitor having a cell plate and a storage node and a memory cell transistor, and said column control circuit further includes a circuit setting a voltage of said cell plate to an external power supply voltage or a ground voltage in accordance with said corresponding one of said plurality of test modes.

5. The semiconductor memory device according to claim 3, wherein each of said plurality of memory cells includes a memory cell capacitor and a memory cell transistor, and said column control circuit further includes a circuit setting a back gate voltage of said memory cell transistor to a ground voltage in accordance with said corresponding one of said plurality of test modes.

6. A semiconductor memory device, comprising:
   a plurality of memory cells each including a memory cell capacitor having a storage node and a cell plate, and a memory cell transistor;
   a test mode setting circuit setting a test mode in accordance with an external signal; and
   a voltage generating circuit generating a cell plate voltage supplied for said cell plate, said voltage generating circuit setting said cell plate voltage such that a stress is applied to said memory cell capacitor in accordance with an output from said test mode setting circuit.

7. The semiconductor memory device according to claim 6, wherein said voltage generating circuit sets said cell plate voltage to an external power supply voltage or a ground voltage in accordance with said output from said test mode setting circuit.

8. A semiconductor memory device, comprising:
a memory cell array including a plurality of memory cells each having a memory cell capacitor and a memory cell transistor;
a test mode setting circuit setting a test mode in accordance with an external signal;
a circuit writing a checker pattern to said memory cell array in accordance with an output from said test mode setting circuit; and
a voltage generating circuit setting a back gate voltage of said memory cell transistor in accordance with said output from said test mode setting circuit.

9. The semiconductor memory device according to claim 8, wherein said voltage generating circuit sets said back gate voltage to a ground voltage in accordance with said output from said test mode setting circuit.

10. A semiconductor memory device, comprising:
an internal circuit including a memory cell array;
a test mode setting circuit serially setting a plurality of test modes in accordance with an external signal;
a circuit writing a checker pattern to said memory cell array in accordance with an output from said test mode setting circuit; and
a voltage generating circuit including a generator generating an internal voltage supplied for said internal circuit, said voltage generating circuit stopping an operation of said generator in accordance with corresponding one of said plurality of test modes.

11. The semiconductor memory device according to claim 10, wherein said voltage generating circuit further includes a fixing circuit setting said internal voltage to a fixed voltage in accordance with said corresponding one of said plurality of test modes.

12. The semiconductor memory device according to claim 10, further comprising an external pad, and wherein said voltage generating circuit further includes a circuit determining a voltage supplied from said external pad as said internal voltage in accordance with said corresponding one of said plurality of test modes.

13. A semiconductor memory device, comprising:
a plurality of internal circuits, one of which including a memory cell array having a plurality of memory cells;
a test mode setting circuit serially setting a plurality of test modes in accordance with an external signal;
a voltage generating circuit setting a plurality of internal voltages supplied for said plurality of internal circuits; and
an external pad, said voltage generating circuit separately setting said plurality of internal voltages based on a voltage received from said external pad in accordance with an output from said test mode setting circuit.

14. The semiconductor memory device according to claim 13, wherein said plurality of internal circuits include:
a first internal circuit including said memory cell array; and
a second internal circuit including a peripheral circuit for selecting said memory cells, said plurality of internal voltages includes:
a first internal voltage supplied for said first internal circuit; and
a second internal voltage supplied for said second internal circuit, and said voltage generating circuit includes:
a circuit setting a first reference voltage and a second reference voltage in accordance with said corresponding one of said plurality of test modes based on a voltage of said external pad;
a circuit setting said first internal voltage in accordance with said first reference voltage; and
a circuit setting said second internal voltage in accordance with said second reference voltage.

* * * * *